(12) United States Patent
Hsieh

(10) Patent No.: US 12,176,397 B2
(45) Date of Patent: Dec. 24, 2024

(54) SUPER BARRIER RECTIFIER WITH SHIELDED GATE ELECTRODE AND MULTIPLE STEPPED EPITAXIAL STRUCTURE

(71) Applicant: Nami MOS CO. LTD., New Taipei (TW)

(72) Inventor: Fu-Yuan Hsieh, New Taipei (TW)

(73) Assignee: NAMI MOS CO., LTD., New Taipei (TW)

( * ) Notice: Subject to any disclaimer, the term of this patent is extended or adjusted under 35 U.S.C. 154(b) by 430 days.

(21) Appl. No.: 17/567,399

(22) Filed: Jan. 3, 2022

(65) Prior Publication Data
US 2023/0215920 A1 Jul. 6, 2023

(51) Int. Cl.
*H01L 29/10* (2006.01)
*H01L 29/40* (2006.01)
*H01L 29/78* (2006.01)

(52) U.S. Cl.
CPC ........ *H01L 29/1095* (2013.01); *H01L 29/407* (2013.01); *H01L 29/7813* (2013.01)

(58) Field of Classification Search
None
See application file for complete search history.

(56) References Cited

U.S. PATENT DOCUMENTS

| | | | |
|---|---|---|---|
| 11,114,558 B2 | 9/2021 | Hsieh | |
| 2013/0020576 A1* | 1/2013 | Hsieh | H01L 29/7811 257/66 |
| 2017/0213908 A1* | 7/2017 | Fursin | H01L 29/407 |
| 2020/0243656 A1* | 7/2020 | Shibib | H01L 29/404 |
| 2021/0104510 A1* | 4/2021 | Hsieh | H01L 29/41766 |
| 2021/0119030 A1* | 4/2021 | Hsieh | H01L 29/87 |
| 2021/0320178 A1* | 10/2021 | Hossain | H01L 29/407 |
| 2021/0351289 A1* | 11/2021 | Hsieh | H01L 29/1095 |

* cited by examiner

Primary Examiner — Sarah K Salerno
(74) Attorney, Agent, or Firm — BACON & THOMAS, PLLC

(57) ABSTRACT

The present invention introduces a new shielded gate trench SBR (Super Barrier Rectifier) wherein an epitaxial layer having special MSE (multiple stepped epitaxial) layers with different doping concentrations decreasing in a direction from a substrate to a top surface of the epitaxial layer, wherein each of the MSE layers has an uniform doping concentration as grown. Forward voltage $V_f$ is significantly reduced with the special MSE layers. An integrated circuit comprising a SGT MOSFET and a SBR formed on a single chip obtains benefits of low on-resistance, low reverse recovery time and high avalanche capability from the special MSE layers.

8 Claims, 13 Drawing Sheets

SUPER BARRIER RECTIFIER WITH SHIELDED GATE ELECTRODE AND MULTIPLE STEPPED EPITAXIAL STRUCTURE

FIELD OF THE INVENTION

This invention relates generally to semiconductor power devices, and more particularly, to a Shielded Gate Trench (SGT) Super Barrier Rectifier (SBR) having Multiple Stepped Epitaxial (MSE) structure to improve the device performance.

BACKGROUND OF THE INVENTION

FIG. 1A shows a conventional SGT MOSFET with a uniform epitaxial layer which has much lower gate charge and specific on-resistance compared with traditional single gate trench MOSFETs as results of the existence of oxide charge balance region (as illustrated in FIG. 1A) in drift region and thick oxide underneath gate electrode. However, as die size of the device becomes smaller due to cell pitches decrease, the conventional SGT MOSFETs confront avalanche capability degradation issue. Typically, two electric field and impact ionization peaks locate near channel region and trench bottom respectively (as shown in FIG. 1B), and the electric field near channel region is always higher than trench bottom in the uniform epitaxial layer, causing avalanche occurrence near the channel region. A parasitic bipolar transistor (n+/p/N) existing in the channel region is easily turned on resulting in device failure at lower avalanche energy ratings.

In U.S. Pat. No. 11,114,558, Hsieh discloses a SGT MOSFET integrated with a SGT SBR on a single chip (as shown in FIG. 1C) for reducing the switching loss. The integrated SBR creates a low potential barrier for majority carrier in MOS channel, which is adjustable by gate oxide thickness, body doping concentration and channel length. The SBR has lower forward voltage Vf and lower reverse leakage current Ir than conventional Schottky Barrier rectifier. Meanwhile, the SBR has better and reliable performance at elevated temperature than the conventional Schottky Barrier rectifier. An epitaxial layer of the integrated circuit disclosed in the patent comprises a single epitaxial layer having an uniform doping concentration as shown in FIG. 1C. Purpose of integrating the SGT SBR into the SGT MOSFET is to avoid a parasitic body diode in the SGT MOSFET from turning on by adjusting forward voltage Vf of the SGT SBR lower than the parasitic body diode of the SGT MOSFET. Switching speed is enhanced because reverse recovery charge Qrr is significantly reduced. Unfortunately, there is a tradeoff between breakdown voltage and the forward voltage Vf due to higher resistivity in drift region for higher breakdown voltage. When breakdown voltage increases, the forward voltage Vf is also increased.

Therefore, there is still a need to provide new device and integrated circuit configurations such that above discussed problems and limitations can be resolved, and DC/AC performance and device ruggedness are further improved by reducing the electric field near channel region so that avalanche occurs at the trench bottom not the channel region.

SUMMARY OF THE INVENTION

The present invention provides a new SGT SBR wherein an epitaxial layer having special MSE layers with different doping concentrations decreasing stepwise in a direction from a substrate to a top surface of the epitaxial layer, wherein each of the MSE layers has a uniform doping concentration as grown. Since doping concentration near the channel region is the lowest, the electric field near channel region is lower than the trench bottom. The avalanche capability or device ruggedness is thus enhanced because the avalanche occurs at trench bottom not in channel region. Moreover, forward voltage Vf is significantly reduced with the special MSE structure.

According to one aspect, the invention features a SGT SBR which is formed in an epitaxial layer of a first conductivity type extending over a substrate of the first conductivity type, the SGT SBR further comprising: a plurality of gate trenches surrounded by source regions of the first conductivity type are encompassed in body regions of a second conductivity type near a top surface of the epitaxial layer, each of the gate trenches is filled with a gate electrode and a shielded gate electrode: the shielded gate electrode is insulated from the epitaxial layer by a first insulating film, the gate electrode is insulated from the epitaxial layer by a gate oxide, the shielded gate electrode and the gate electrode are insulated from each other by an (Inter-Poly Oxide) IPO film, the gate oxide surrounding the gate electrode has less thickness than the first insulating film: an oxide charge balance region is formed between two adjacent of the gate trenches: the body regions, the shielded gate electrode, the gate electrode, and the source regions are shorted together to a source metal through a plurality of trench contacts; and the epitaxial layer has the MSE layers with different doping concentrations decreasing stepwise in a direction from the substrate to a top surface of the epitaxial layer, wherein each of the MSE layers has an uniform doping concentration as grown.

According to another aspect, in some preferred embodiments, the gate electrode is disposed above the shielded gate electrode. In some other preferred embodiments, the shielded electrode is disposed in the middle and the gate electrode is disposed surrounding upper portions of the shielded electrode.

According to another aspect, in some preferred embodiments, the epitaxial layer comprises at least two stepped epitaxial layers of different doping concentrations including a bottom epitaxial layer with a doping concentration D1 and a top epitaxial layer above the bottom epitaxial layer with a doping concentration D2, wherein D2<D1. In some other preferred embodiments, the epitaxial layer comprises at least three stepped epitaxial layers of different doping concentrations including a bottom epitaxial layer with doping concentration D1, a middle epitaxial layer with doping concentration D2 and a top epitaxial layer with doping concentration D3, wherein D3<D2<D1.

According to another aspect, in some preferred embodiments, the MSE layers have a bottom epitaxial layer above the substrate and beyond bottom of the gate trenches.

According to another aspect, in some preferred embodiments, each sidewall of the gate trenches is substantially vertical to top surface of the epitaxial layer and has an angle with top surface of the epitaxial layer ranging from 88 to 90 degree.

According to another aspect, in some preferred embodiments, the first conductivity type is N type and the second conductivity type is P type. In some other preferred embodiments, the first conductivity type is P type and second conductivity is N type.

The present invention also features an integrated circuit comprising a SGT MOSFET and a SBR formed on a single chip, and obtains benefits of low on-resistance, low reverse recovery time and high avalanche capability from the special MSE structure.

According to one aspect, the invention features an integrated circuit comprising a SGT MOSFET and a SBR horizontally disposed in two different areas on a single chip, further comprising: an epitaxial layer of a first conductivity type extending over a substrate of the first conductivity type, the substrate having a higher doping concentration than the epitaxial layer: the SGT MOSFET further comprising: a plurality of first type trenches formed in the epitaxial layer, each of the first type trenches being filled with a first shielded electrode and a first gate electrode, the shielded electrode being insulated from the epitaxial layer by a first insulating film, the first gate electrode being insulated from the epitaxial layer by a first gate oxide, the first shielded electrode and the first gate electrode being insulated from each other: a first body region of a second conductivity type having a first source region of the first conductivity type thereon and surrounding the first gate electrode padded by the first gate oxide: the SBR further comprising: at least one second type trench formed in parallel with the first type trenches, the second type trench being filled with a second shielded electrode and a second gate electrode, the second shielded electrode being insulated from the epitaxial layer by a second insulating film, the second gate electrode being insulated from the epitaxial layer by a second gate oxide, the second shielded electrode and the second gate electrode being insulated from each other: the second gate oxide having a thickness less than the first gate oxide: a second body region of the second conductivity type having a second source region thereon and surrounding the second gate electrode padded by the second gate oxide: the first body region, the second body region, the first source region, the second source region, and the second gate electrode being shorted to a source metal through a plurality of trenched contacts: the second body region having a shallower junction depth and a lower doping concentration than the first body region; and the epitaxial layer having MSE layers with different doping concentrations decreasing stepwise in a direction from the substrate to a top surface of the epitaxial layer, wherein each of the MSE layers has an uniform doping concentration as grown.

According to another aspect, in some preferred embodiments, the epitaxial layer comprises at least two stepped epitaxial layers of different doping concentrations including a bottom epitaxial layer with a doping concentration D1 and a top epitaxial layer above the bottom epitaxial layer with a doping concentration D2, wherein D2<D1. In some other preferred embodiments, the epitaxial layer comprises at least three stepped epitaxial layers of different doping concentration including a bottom epitaxial layer with doping concentration D1, a middle epitaxial layer with doping concentration D2 and a top epitaxial layer with doping concentration D3, wherein D3<D2<D1.

According to another aspect, in some preferred embodiments, the MSE layers have a bottom epitaxial layer above the substrate and beyond bottom of the gate trenches.

According to another aspect, in some preferred embodiments, within each of the first type trenches, the first shielded electrode is disposed in a lower portion and the first gate electrode is disposed in an upper portion, the first shielded electrode and the first gate electrode are insulated from each other by a third insulating film: within the second type trench, the second shielded electrode is disposed in a lower portion and the second gate electrode is disposed in an upper portion, the second shielded electrode and the second gate electrode are insulated from each other by a fourth insulating film. In some other preferred embodiments, within each of the first type trenches, the first shielded electrode is disposed in the middle and the first gate electrode is disposed surrounding upper portion of the first shielded electrode, the first shielded electrode and the first gate electrode are insulated from each other by a third insulating film: within the second type trench, the second shielded electrode is disposed in the middle and the second gate electrode is disposed surrounding upper portion of the second shielded electrode, the second shielded electrode and the second gate electrode are insulated from each other by a fourth insulating film.

According to another aspect, in some preferred embodiments, the second type trench has trench width and trench depth same as the first type trenches. In some other preferred embodiments, the second type trench has trench width and trench depth greater than the first type trenches.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The accompanying drawings, which are included to provide a further understanding of the invention and are incorporated in and constitute a part of this specification, illustrate exemplary embodiments of the invention and together with the description to explain the principles of the invention. In the drawings.

DETAILED DESCRIPTION OF THE EMBODIMENTS

In the following Detailed Description, reference is made to the accompanying drawings, which forms a part thereof, and in which is shown by way of illustration specific embodiments in which the invention may be practiced. In this regard, directional terminology, such as "top", "bottom", "front", "back", etc., is used with reference to the orientation of the Figure(s) being described. Because components of embodiments can be positioned in a number of different orientations, the directional terminology is used for purpose of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1A:
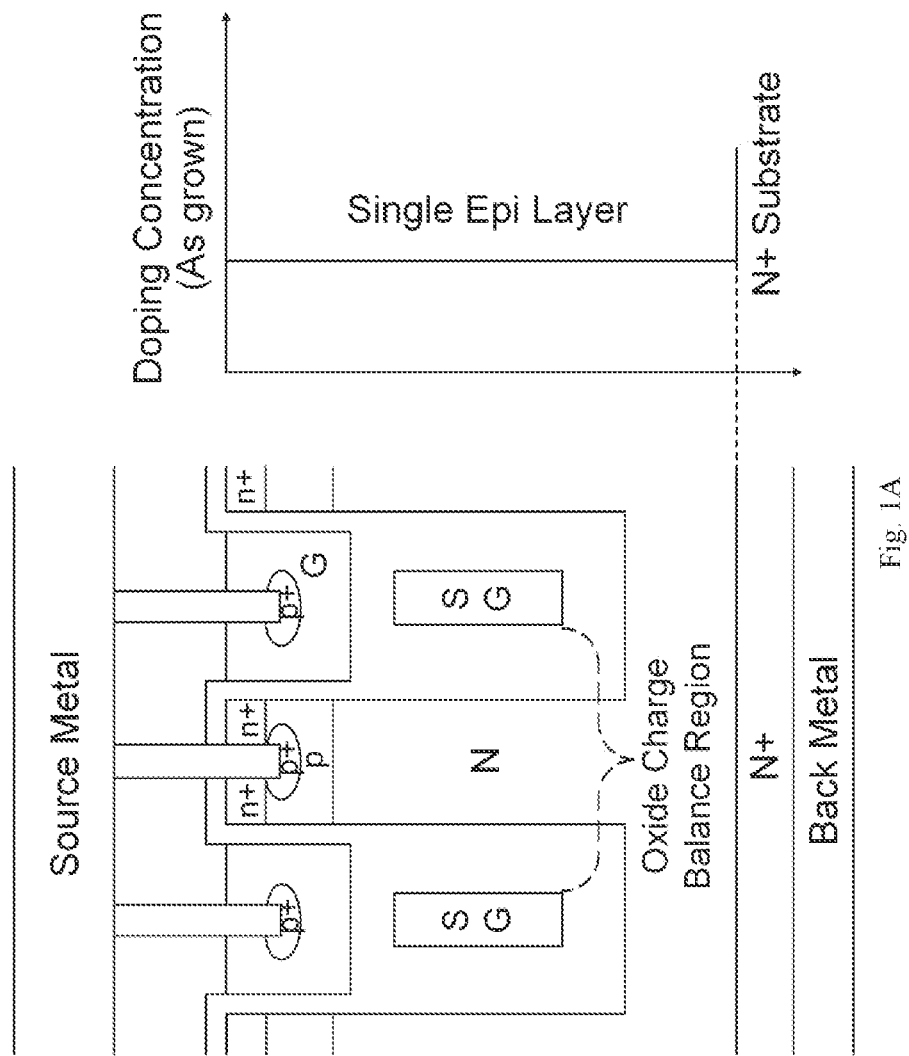
FIG. 1A is a cross-sectional view of a conventional SGT MOSFET with single epitaxy layer of prior art.
Figure 1B:
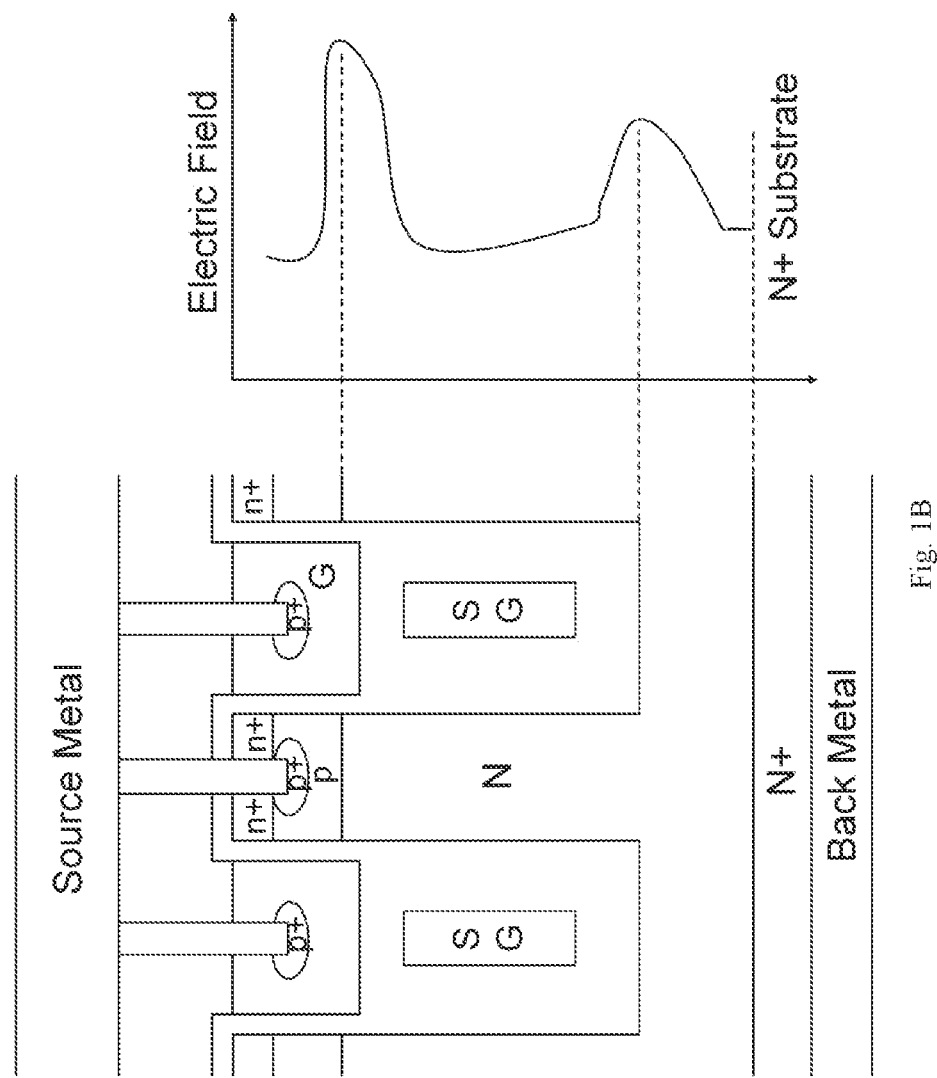
FIG. 1B is the cross-sectional view of the conventional SGT MOSFET illustrated in FIG. 1A, wherein electric filed distribution is depicted along the vertical direction.
Figure 1C:
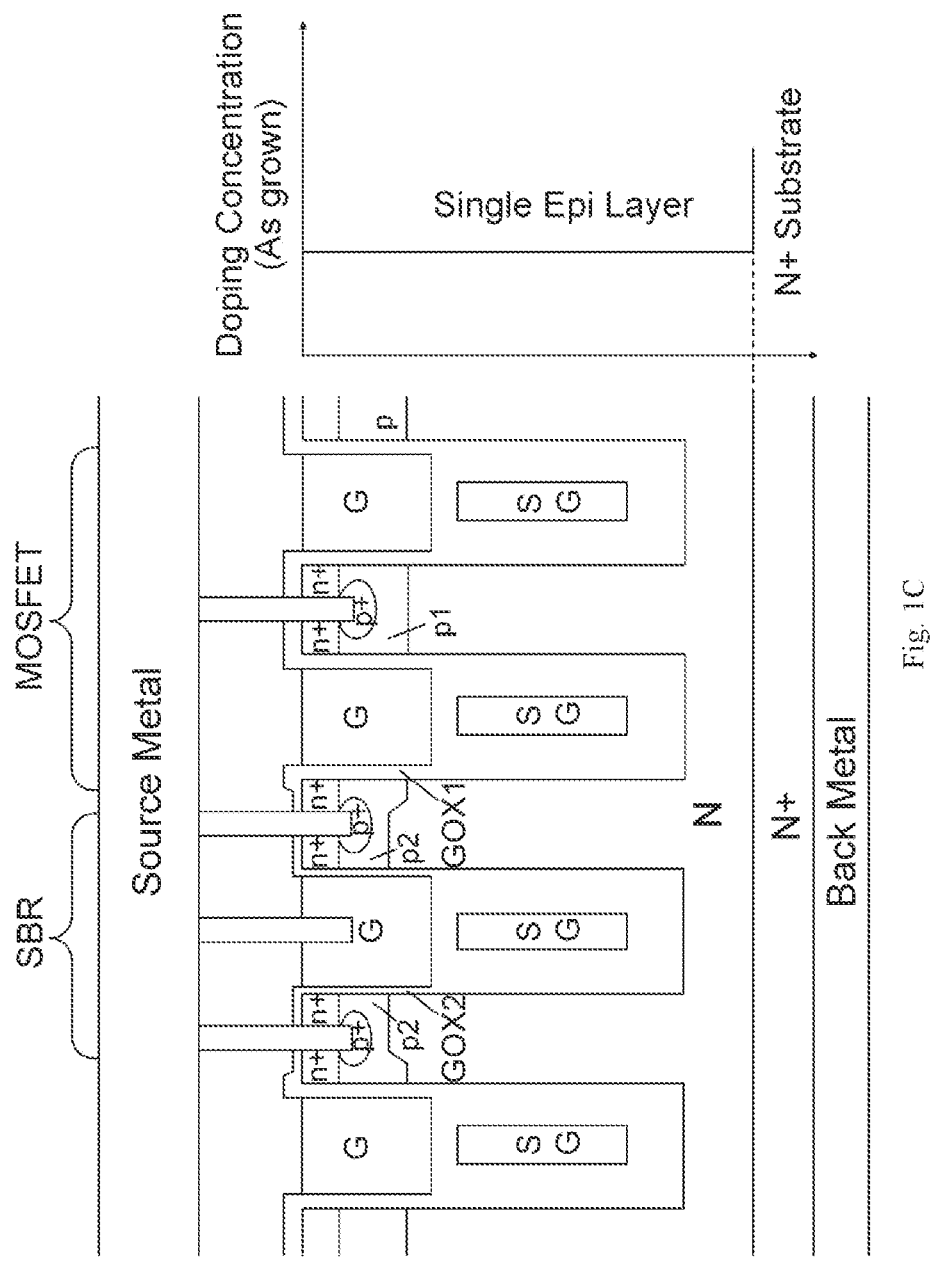
FIG. 1C is a cross-sectional view of another SGT MOSFET with single epitaxy layer of prior art.
Figure 2A:
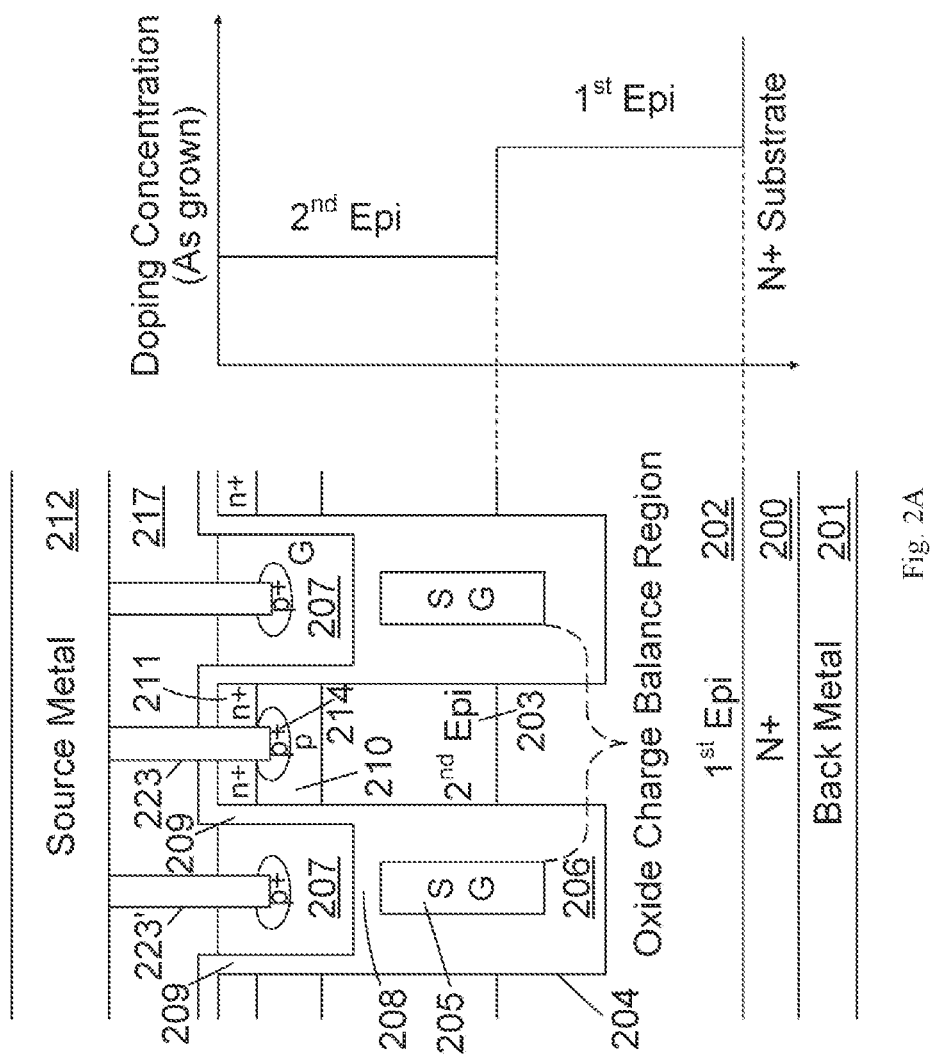
FIG. 2A is a cross-sectional view of a preferred embodiment with new and improved device structure having two stepped epitaxial layers wherein the doping concentration variations are depicted along the vertical direction according to the present invention.

Please refer to FIG. 2A for a preferred embodiment of this invention with new and improved device structure having two stepped epitaxial layers wherein the doping concentration variations as grown are depicted along the vertical direction. The device comprises an N-channel SGT MOSFET formed in an N type epitaxial layer onto an N+substrate 200 coated with a back metal 201 of Ti/Ni/Ag on rear side as a drain metal. The N type epitaxial layer comprises a bottom $1^{st}$ epitaxial layer ($1^{st}$ Epi, as illustrated) 202 with a doping concentration D1 and a top $2^{nd}$ epitaxial layer ($2^{nd}$ Epi, as illustrated) 203 above the bottom $1^{st}$ epitaxial layer 202 with a doping concentration D2, wherein D2<D1, to increase the breakdown voltage and lower the specific on-resistance. Inside the N type epitaxial layer, a plurality of gate trenches 204 are formed extending from a top surface of the $2^{nd}$ epitaxial layer 203 and vertically downward into the $1^{st}$ epitaxial layer 202, wherein trench bottoms of the gate trenches 204 are above a common interface between the N+substrate 200 and the $1^{st}$ epitaxial layer 202. Inside each of the gate trenches 204, a shielded gate electrode (SG, as illustrated) 205 is disposed in the lower portion and a single gate electrode (G, as illustrated) 207 is disposed in the upper portion. The shielded gate electrode 205 is insulated from the adjacent epitaxial layer by a first insulating film 206 in drift regions below P body regions 210 and between adjacent gate trenches 204, and the gate electrode 207 is insulated from the adjacent epitaxial layer by a gate oxide 209, wherein the gate oxide 209 has a thinner thickness than the first insulating film 206 which has uniform thickness along trench sidewalls, meanwhile, the shielded gate electrode 205 and the gate electrode 207 is insulated from each other by an (Inter-Poly Oxide) IPO film 208. Between every two adjacent gate trenches 204, the P body regions 210 with n+source regions 211 thereon are extending near top surface of the upper $2^{nd}$ epitaxial layer 203. The P body regions 210, the n+source regions 211, and the gate electrode 207 are further shorted together to a source metal 212 through a plurality of trenched contacts 223 or 223' filled with contact plugs and barriers implemented by penetrating through a contact insulating layer 217 and surrounded by p+heavily doped regions 214 around bottoms underneath the n+source regions 211. According to the invention, an oxide charge balance region is therefore formed between adjacent of the gate trenches 204.

Figure 2B:
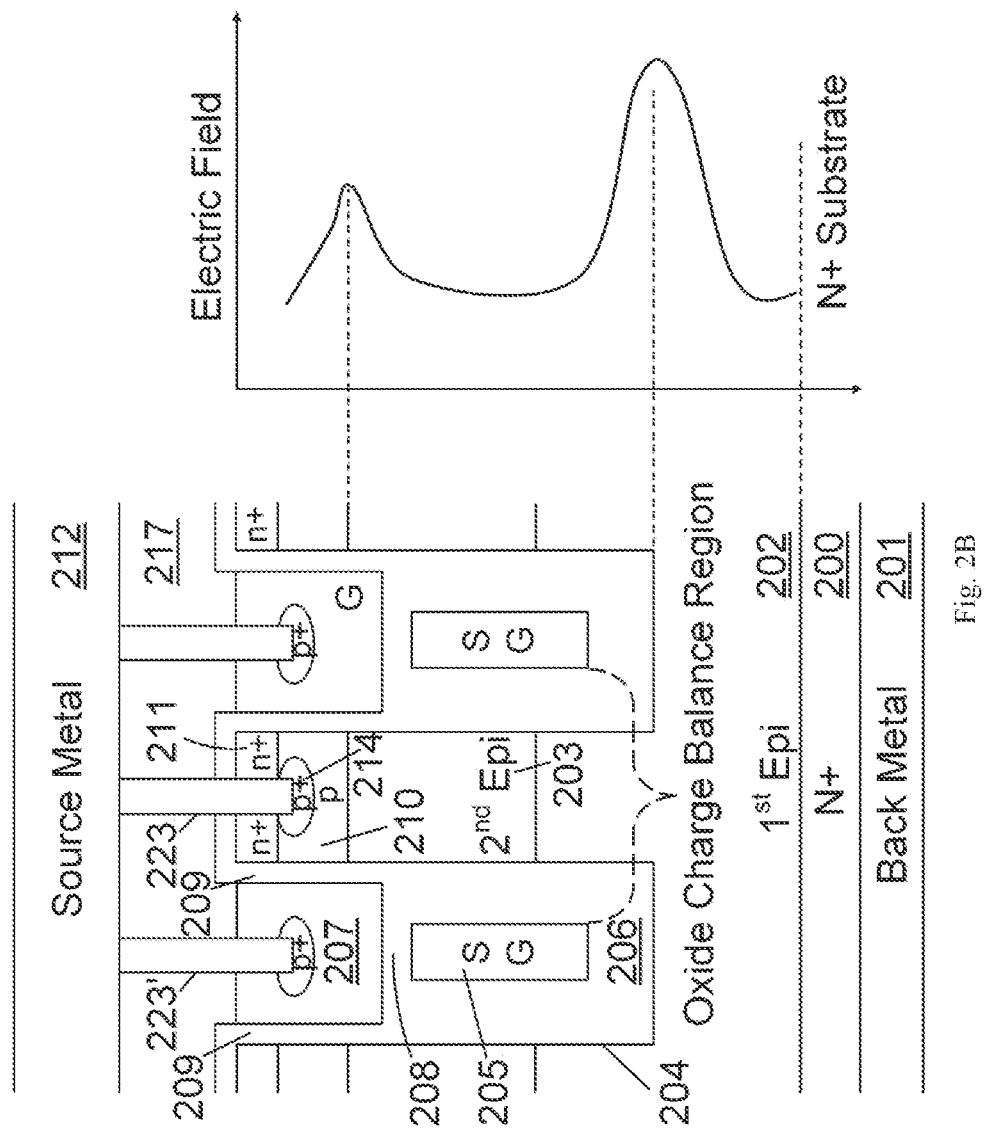
FIG. 2B is the cross-sectional view of the preferred embodiment illustrated in FIG. 2A, wherein electric filed distribution is depicted along the vertical direction.

Please refer to FIG. 2B for the cross-sectional view of the preferred embodiment illustrated in FIG. 2A, wherein electric filed distribution is depicted along the vertical direction. The N type epitaxial layer comprises a bottom $1^{st}$ epitaxial layer ($1^{st}$ Epi, as illustrated) 202 with a uniform doping concentration D1 and a top $2^{nd}$ epitaxial layer ($2^{nd}$ Epi, as illustrated) 203 above the bottom $1^{st}$ epitaxial layer 202 with a uniform doping concentration D2, wherein D2<D1. Two electric field peaks are observed near a channel region and a trench bottom respectively. Since doping concentration near the channel region is lower than the trench bottom, the electric field near the channel region is lower than the trench bottom. The avalanche capability or device ruggedness is thus enhanced because the avalanche occurs near trench bottom not near the channel region. Moreover, forward voltage Vf is significantly reduced with the special MSE structure.

Figure 3A:
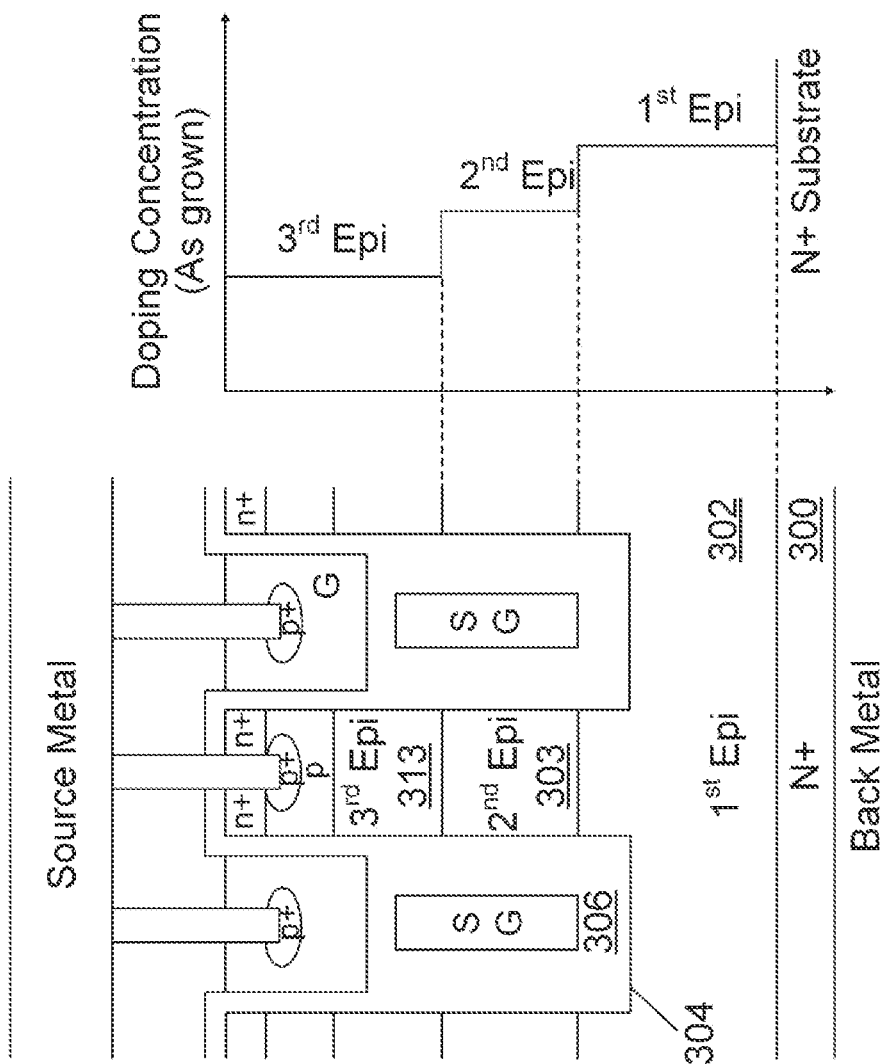
FIG. 3A is a cross-sectional view of another preferred embodiment with new and improved device structure having three stepped epitaxial layers wherein the doping concentration variations are depicted along the vertical direction according to the present invention.

Please refer to FIG. 3A for another preferred embodiment of the present invention with new and improved device structure having three stepped epitaxial layers wherein the doping concentration variations as grown are depicted along the vertical direction. The N-channel trenched semiconductor power device has a similar structure to FIG. 2A, except that, in FIG. 3A, the N type epitaxial layer comprises three stepped epitaxial layers of different doping concentration including a bottom $1^{st}$ epitaxial layer ($1^{st}$ Epi, as illustrated) 302 with doping concentration D1, a middle $2^{nd}$ epitaxial layer ($2^{nd}$ Epi, as illustrated) 303 with doping concentration D2 and a top $3^{rd}$ epitaxial layer ($3^{rd}$ Epi, as illustrated) 313 with doping concentration D3, wherein D3<D2<D1, to further reduce the specific on-resistance. The D2 can be an average of D1 and D3.

Figure 3B:
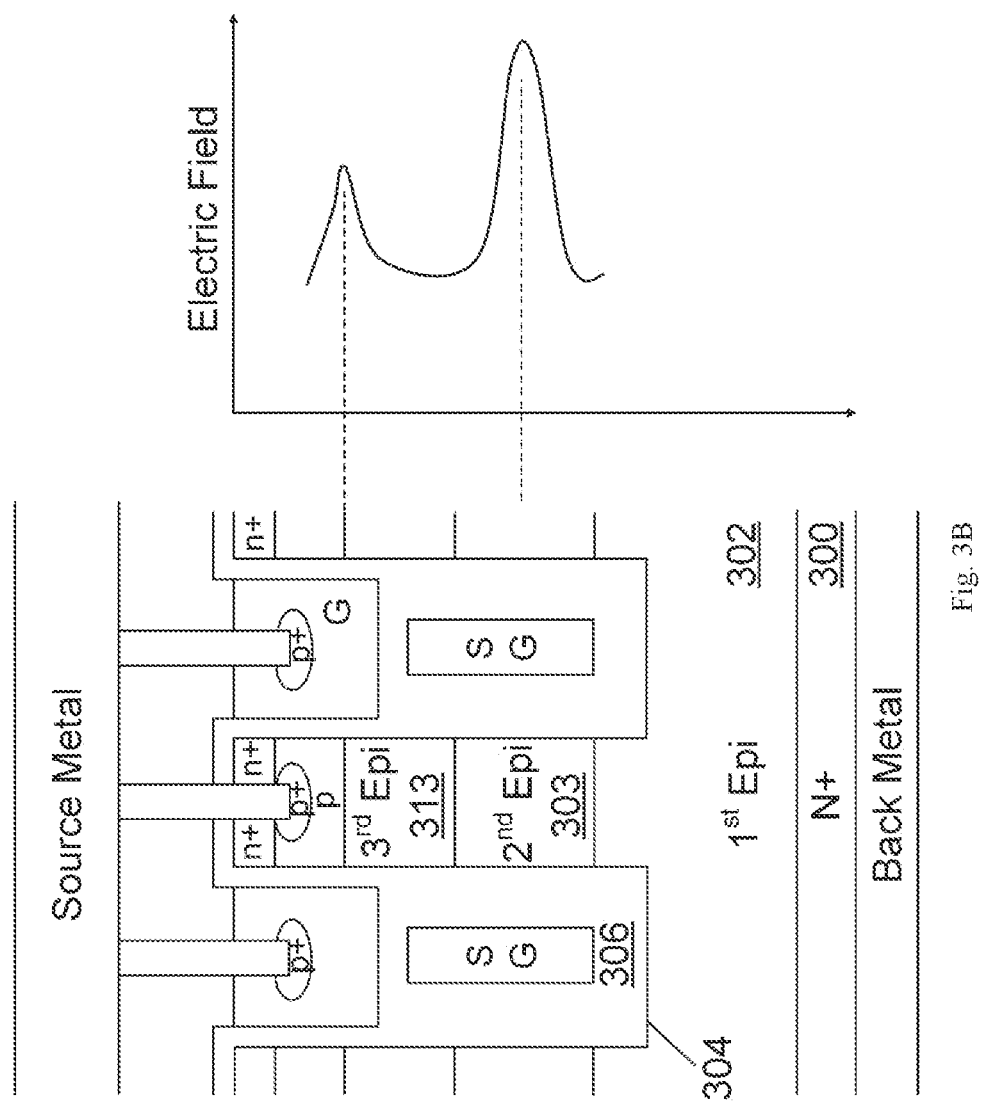
FIG. 3B is a cross-sectional view of the preferred embodiment illustrated in FIG. 3A, wherein electric filed distribution is depicted along the vertical direction.

Please refer to FIG. 3B for the cross-sectional view of the preferred embodiment illustrated in FIG. 3A, wherein electric filed distribution is depicted along the vertical direction. The N type epitaxial layer comprises a bottom $1^{st}$ epitaxial layer ($1^{st}$ Epi, as illustrated) 302 with a uniform doping concentration D1, a middle $2^{nd}$ epitaxial layer ($2^{nd}$ Epi, as illustrated) 303 with doping concentration D2 and a top $3^{rd}$ epitaxial layer ($3^{rd}$ Epi, as illustrated) 313 with doping concentration D3, wherein D3<D2<D1. Two electric field peaks locate near a channel region and in the middle of the $2^{nd}$ epitaxial layer respectively. The electric field near channel region is lower than that in the middle of the $2^{nd}$ epitaxial layer. The avalanche capability or device ruggedness is thus enhanced because the avalanche occurs in the middle of the $2^{nd}$ epitaxial layer not near the channel region. Moreover, forward voltage Vf is significantly reduced with the special MSE structure.

Figure 4:
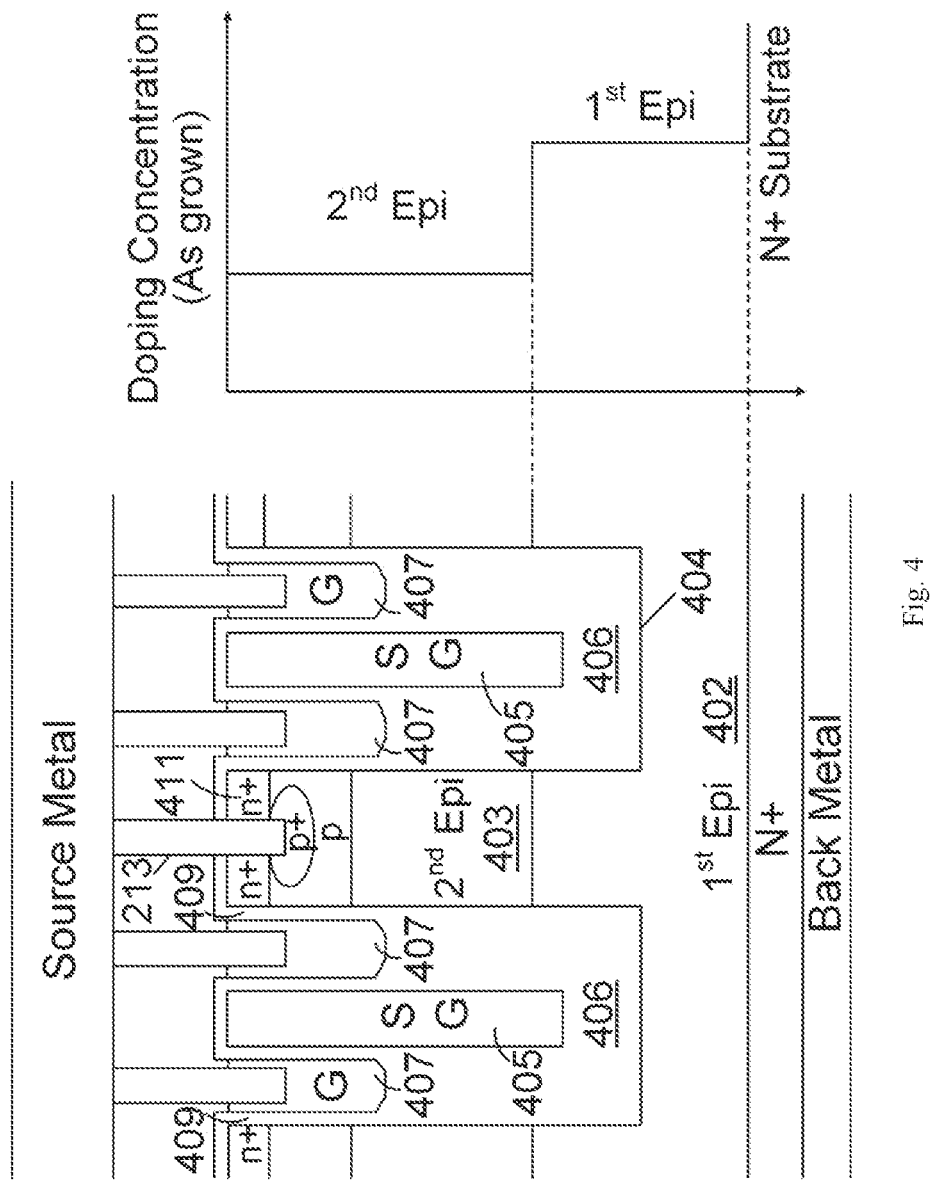
FIG. 4 is a cross-sectional view of another preferred embodiment with new and improved device structure having two stepped epitaxial layers wherein the doping concentration variations are depicted along the vertical direction according to the present invention.

Please refer to FIG. 4 for another preferred embodiment of the present invention with new and improved device structure having two stepped epitaxial layers wherein the doping concentration variations as grown are depicted along the vertical direction. The N-channel trenched semiconductor power device has a similar structure to FIG. 2A, except for the different shielded gate structure in the gate trenches 404. Inside each of the gate trenches 404, a shielded gate electrode (SG, as illustrated) 405 is disposed in the middle and gate electrode (G, as illustrated) 407 is disposed in the upper portion surrounding upper portions of the shielded electrode 405.

Figure 5:
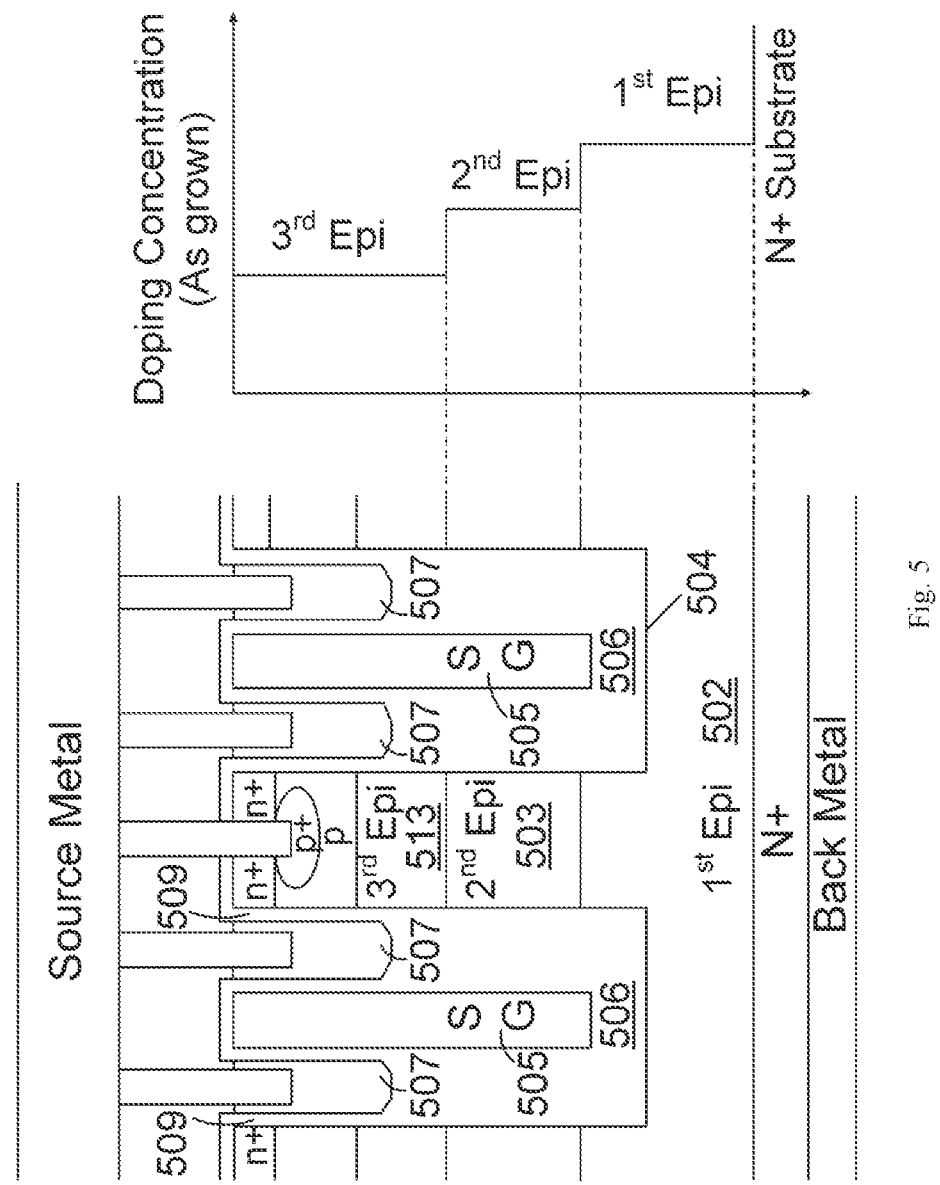
FIG. 5 is a cross-sectional view of another preferred embodiment with new and improved device structure having three stepped epitaxial layers wherein the doping concentration variations are depicted along the vertical direction according to the present invention.

Please refer to FIG. 5 for another preferred embodiment of the present invention with new and improved device structure having three stepped epitaxial layers wherein the doping concentration variations as grown are depicted along the vertical direction. The N-channel trenched semiconductor power device has a similar structure to FIG. 4, except that, in FIG. 5, the N type epitaxial layer comprises three stepped epitaxial layers of different doping concentration including a bottom $1^{st}$ epitaxial layer ($1^{st}$ Epi, as illustrated) 502 with doping concentration D1, a middle $2^{nd}$ epitaxial layer ($2^{nd}$ Epi, as illustrated) 503 with doping concentration D2 and a top $3^{rd}$ epitaxial layer ($3^{rd}$ Epi, as illustrated) 513 with doping concentration D3, wherein D3<D2<D1, to further reduce the specific on-resistance. The D2 can be an average of D1 and D3.

Figure 6:
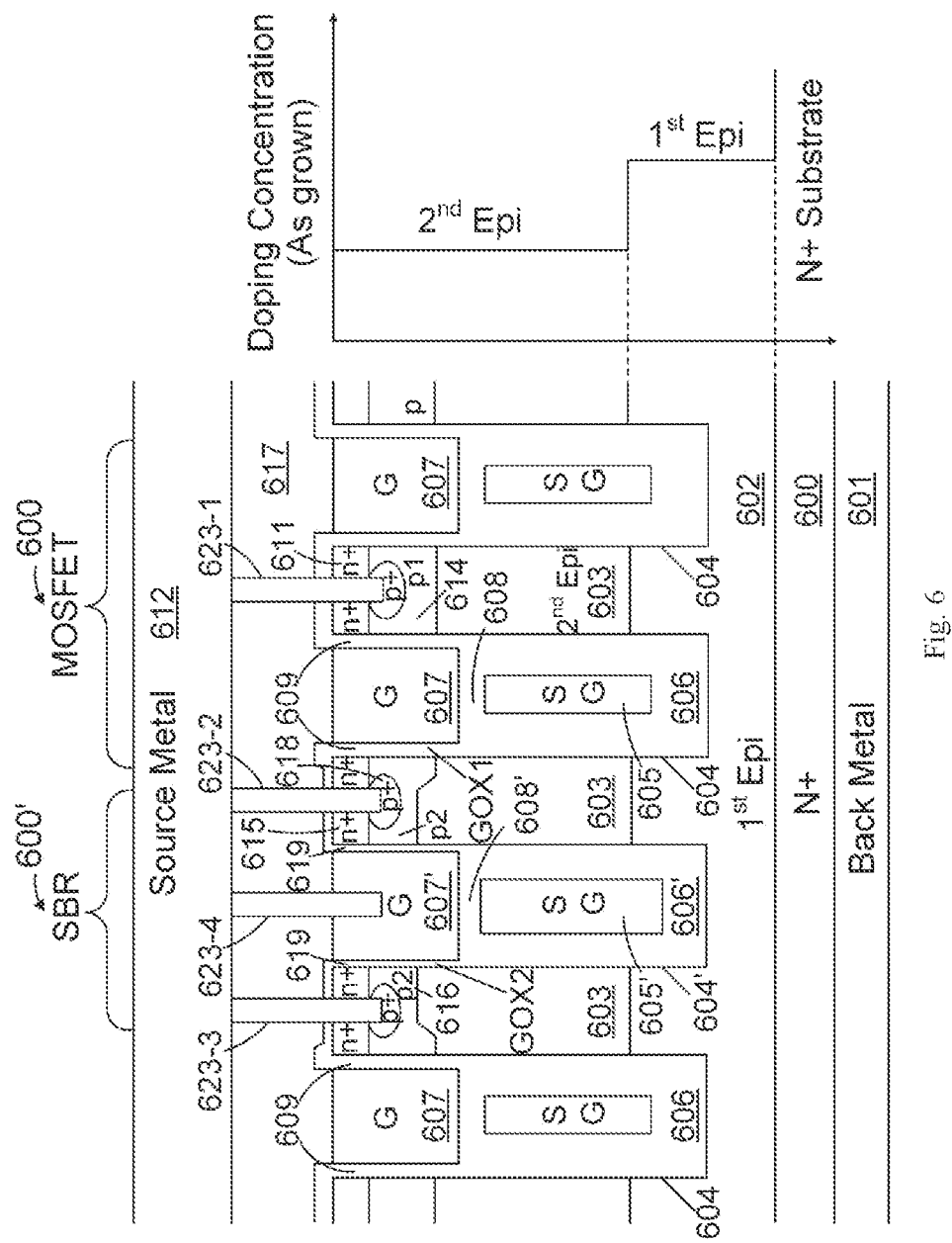
FIG. 6 is a cross-sectional view of another preferred embodiment with new and improved device structure having two stepped epitaxial layers wherein the doping concentration variations are depicted along the vertical direction according to the present invention.

Please refer to FIG. 6 for a preferred embodiment of this invention wherein an N-channel SGT MOSFET 600 and an SBR 600' are integrated on a single chip which is formed on an N+substrate 600 with a less doped two stepped N epitaxial layer extending thereon, wherein the N+substrate is coated with a back metal 601 of Ti/Ni/Ag on rear side as a drain metal. The N type epitaxial layer comprises a bottom $1^{st}$ epitaxial layer ($1^{st}$ Epi, as illustrated) 602 with a doping concentration D1 and a top $2^{nd}$ epitaxial layer ($2^{nd}$ Epi, as illustrated) 603 above the bottom $1^{st}$ epitaxial layer 602 with a doping concentration D2, wherein D2<D1, to increase the breakdown voltage and lower the specific on-resistance. Inside the N epitaxial layer, a plurality of first type trenches 604 and at least one second type trench 604' are formed vertically downward. The difference of the filling-in structure between the first and the second type trenches is that: the first type trenches 604 comprise a first shielded electrode 605 (SG, as illustrated) and a first gate electrode 607 (G, as illustrated), the first shielded electrode 605 is insulated from the epitaxial layer by a first insulating film 606, the first gate electrode 607 is insulated from the epitaxial layer by a first gate oxide 609 (GOX1), the first shielded electrode 605 and the first gate electrode 607 are insulated from each other by a third insulating film 608, and the first gate electrode 607 is further connected to a gate metal (not shown) of the SGT 600; the second type trench 604' comprises a second shielded electrode 605' and a second gate electrode 607, the second shielded electrode 605' is insulated from the epitaxial layer by a second insulating film 606', the second gate electrode 607' is insulated from the epitaxial layer by a second gate oxide 619 (GOX2), wherein the second gate oxide 619 has a thinner thickness than the first gate oxide 609 for formation of SBR, the second shielded electrode 605' and the second gate electrode 607' are insulated from each other by a fourth insulating film 608', and furthermore, the second gate electrode 607' is connected to a source metal 612 through a trenched contact 623-4. In the SGT MOSFET, a p1 body region 614 having a first n+source region 611 thereon is extending in upper portion of the N epitaxial layer and surrounding the first gate electrodes 607 padded by the first gate oxide 609: while in the SBR, a p2 body region 616 having the second n+source region 615 thereon is extending in upper portion of the N epitaxial layer and surrounding the second gate electrode 607 padded by the second gate oxide 619, wherein the p2 body region 616 has a shallower junction depth and a lower doping concentration than the p1 body region 614. The p1 body region 614, the p2 body region 616, the first n+source region 611 and the second n+source region 615 are shorted to a source metal 612 through a plurality of trenched contacts 623-1, 623-2 and 623-3. All the trenched contacts (623-1~623-3) filled with metal plug and barriers are implemented by penetrating through a contact insulating layer 617 and extending into the body regions, with each bottom surrounded by a p+body contact region 618. Trench width and depth of the second type trench 604' are equal to or wider than the first type trenches 604 to avoid early breakdown occurring at the SBR region.

Figure 7:
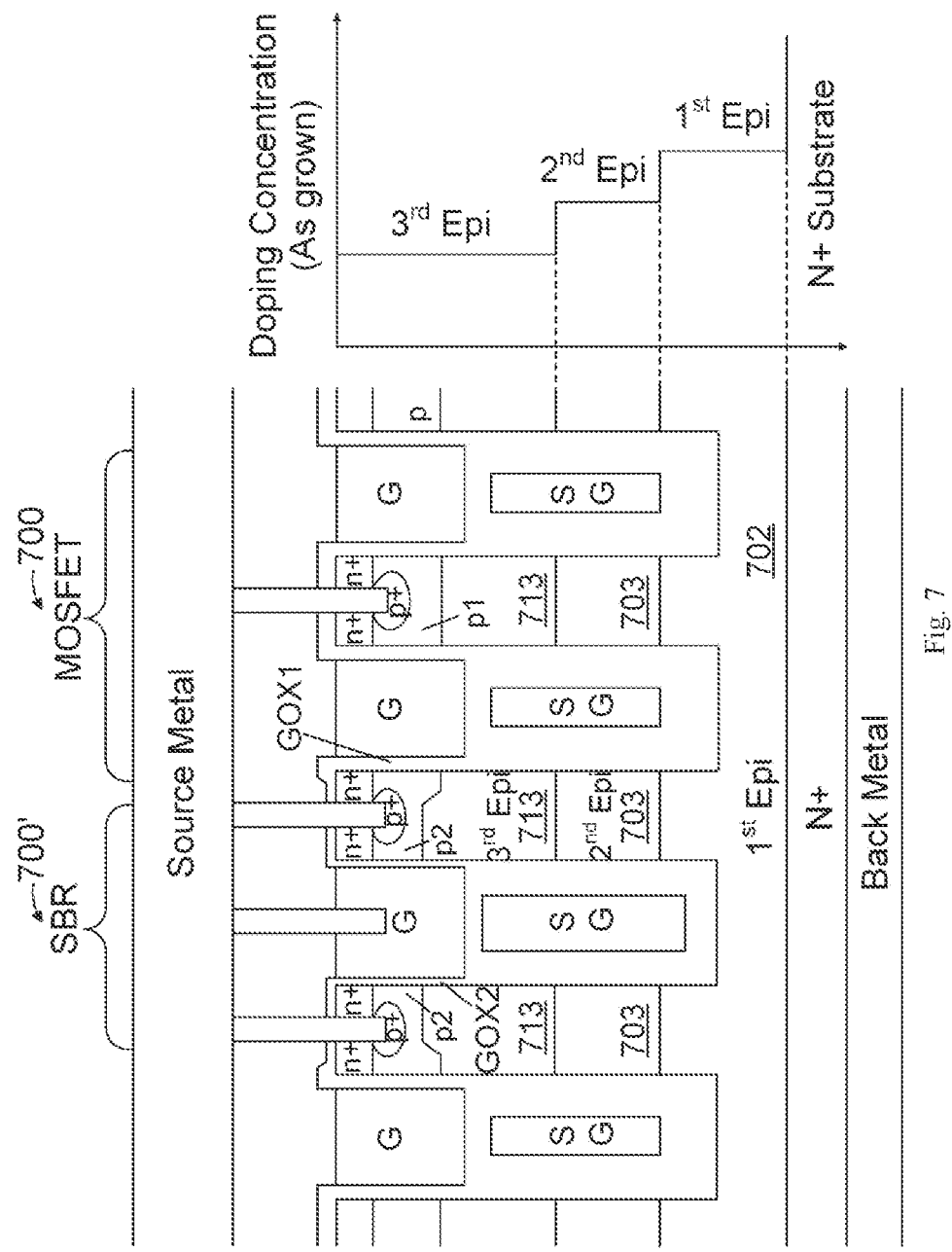
FIG. 7 is a cross-sectional view of another preferred embodiment with new and improved device structure having three stepped epitaxial layers wherein the doping concentration variations are depicted along the vertical direction according to the present invention.

Please refer to FIG. 7 for another preferred embodiment of the present invention with new and improved device structure having three stepped epitaxial layers wherein the doping concentration variations as grown are depicted along the vertical direction. The N-channel trenched semiconductor power device has a similar structure to FIG. 6, except that, in FIG. 7, the N type epitaxial layer comprises three stepped epitaxial layers of different doping concentration including a bottom $1^{st}$ epitaxial layer ($1^{st}$ Epi, as illustrated) 702 with doping concentration D1, a middle $2^{nd}$ epitaxial layer ($2^{nd}$ Epi, as illustrated) 703 with doping concentration D2 and a top $3^{rd}$ epitaxial layer ($3^{rd}$ Epi, as illustrated) 713 with doping concentration D3, wherein D3<D2<D1, to further reduce the specific on-resistance. The D2 can be an average of D1 and D3.

Figure 8:
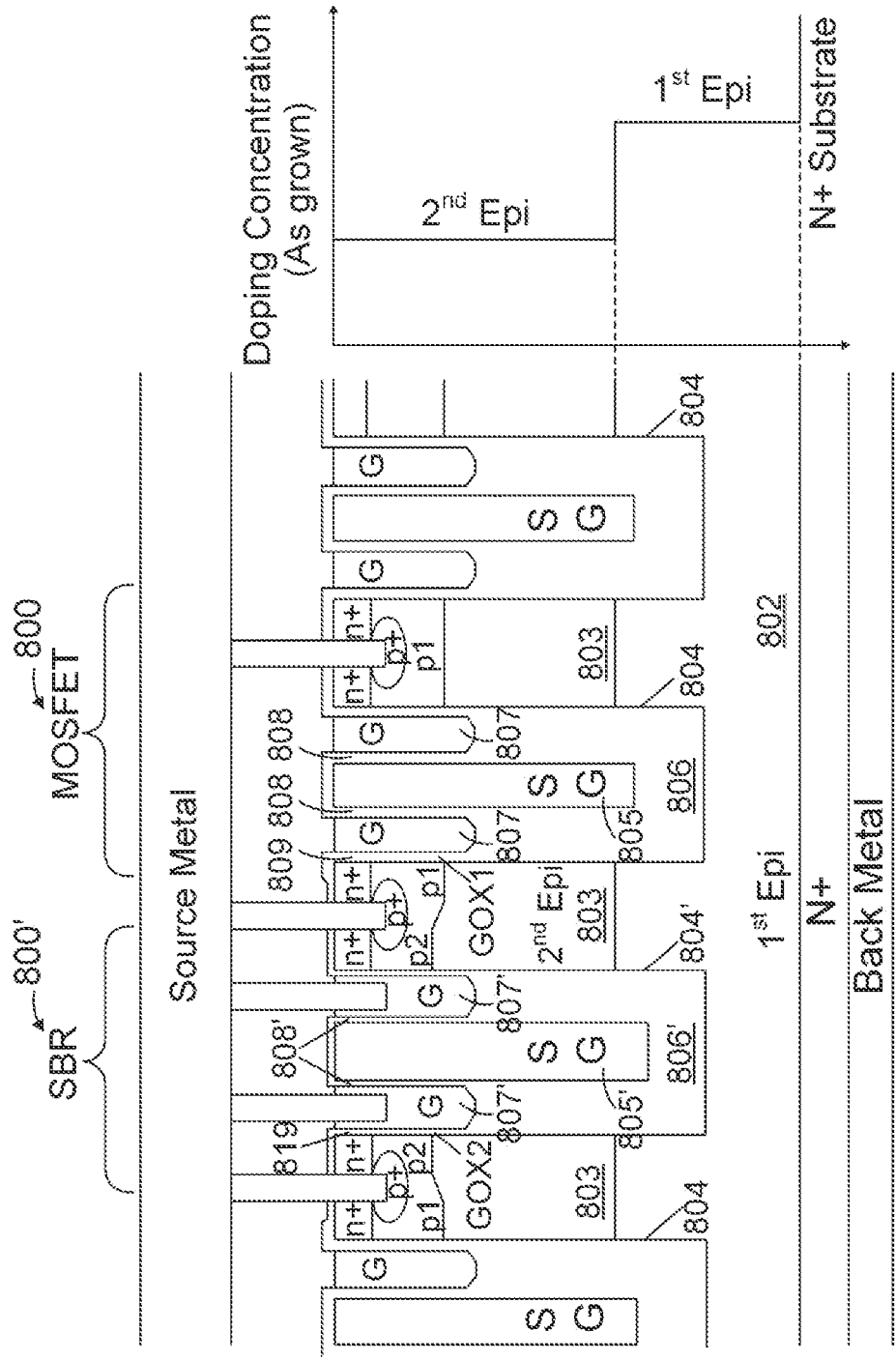
FIG. 8 is a cross-sectional view of another preferred embodiment with new and improved device structure having two stepped epitaxial layers wherein the doping concentration variations are depicted along the vertical direction according to the present invention.

Please refer to FIG. 8 for another preferred embodiment of the present invention wherein the doping concentration variations as grown are depicted along the vertical direction. The integrated circuit comprising an N-channel SGT MOSFET 800 and a SBR 800' has a similar device structure to FIG. 6, except that, in FIG. 8, the first type trenches 804 and the second type trench 804' comprise a different shielded gate structure. In the first type trenches 804 of the SGT MOSFET 800, the shielded gate structure comprises: a first shielded electrode 805 disposed in the middle of the trench, a first gate electrode 807 disposed in the middle of the shielded electrode 805 and the trench sidewall in upper portion of the first type trenches 804, wherein the shielded electrode 805 is insulated from the N epitaxial layer by a first insulating film 806, the first gate electrode 807 is isolated from the epitaxial layer by a first gate oxide 809 (GOX1), the first gate electrode 807 and the shielded electrode 805 are isolated from each other by a third insulating film 808. In the second type trench 804' of the SBR 800', the shielded gate structure comprises: a second shielded electrode 805' disposed in the middle of the trench 804', a second gate electrode 807' disposed in the middle of the second shielded electrode 805' and the trench sidewall in upper portion of the second type trench 804", wherein the second shielded electrode 805' is insulated from the N epitaxial layer by the second insulating film 806', the second gate electrode 807' is isolated from the epitaxial layer by a second gate oxide 819 (GOX2), wherein the second gate oxide 819 has a thickness less than the first gate oxide 809, the second gate electrode 807' and the second shielded electrode 805' are isolated from each other by a fourth insulating film 808'. Trench width and depth of the second type trench 804' are equal to or wider than the first type trenches 804 to avoid early breakdown occurring at the SBR region.

Figure 9:
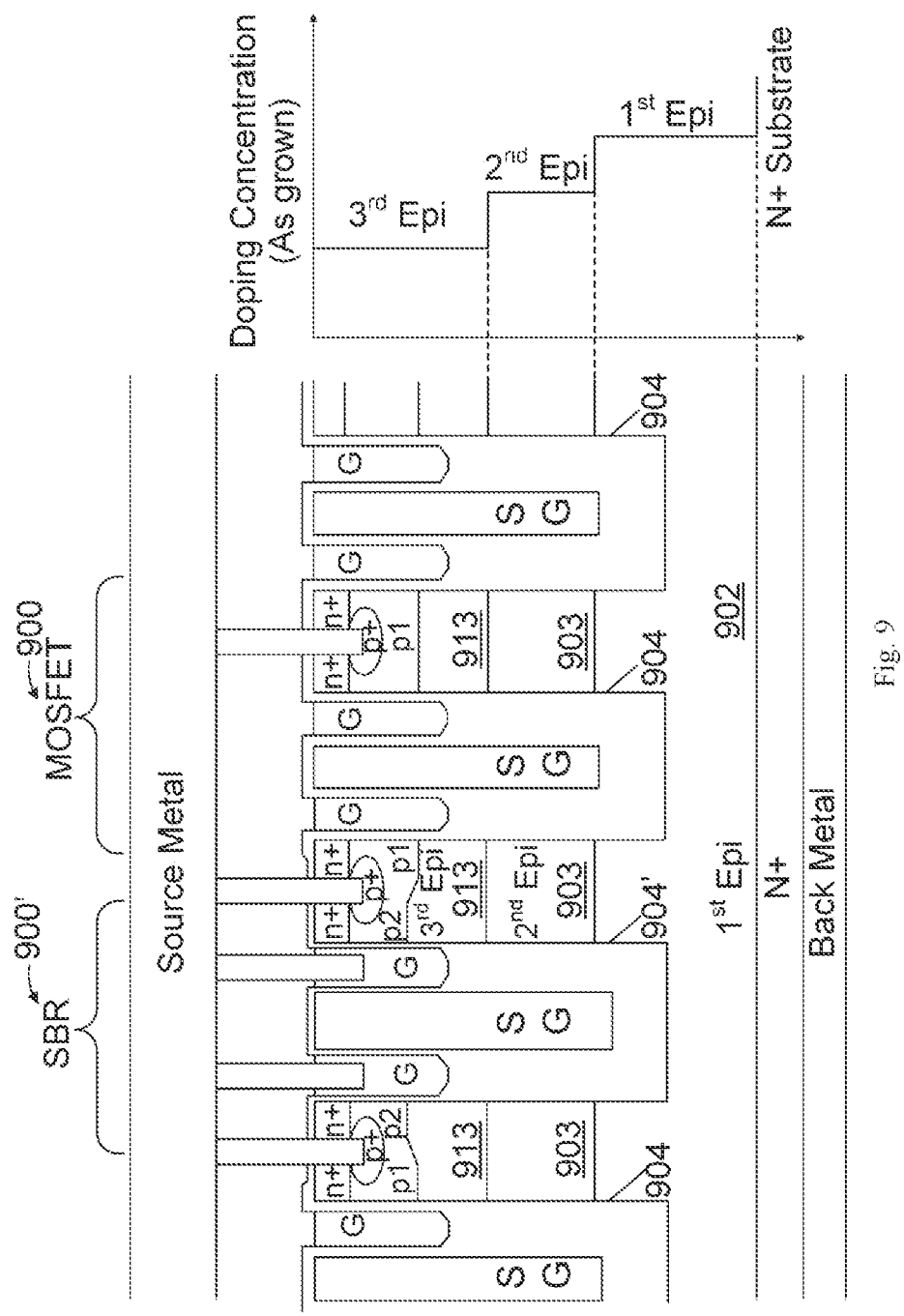
FIG. 9 is a cross-sectional view of another preferred embodiment with new and improved device structure having three stepped epitaxial layers wherein the doping concentration variations are depicted along the vertical direction according to the present invention.

Please refer to FIG. 9 for another preferred embodiment of the present invention with new and improved device structure having three stepped epitaxial layers wherein the doping concentration variations as grown are depicted along the vertical direction. The N-channel trenched semiconductor power device has a similar structure to FIG. 8, except that, in FIG. 9, the N type epitaxial layer comprises three stepped epitaxial layers of different doping concentration including a bottom $1^{st}$ epitaxial layer ($1^{st}$ Epi, as illustrated) 902 with doping concentration D1, a middle $2^{nd}$ epitaxial layer ($2^{nd}$ Epi, as illustrated) 903 with doping concentration D2 and a top $3^{rd}$ epitaxial layer ($3^{rd}$ Epi, as illustrated) 913 with doping concentration D3, wherein D3<D2<D1, to further reduce the specific on-resistance. The D2 can be an average of D1 and D3.

Although the present invention has been described in terms of the presently preferred embodiments, it is to be understood that such disclosure is not to be interpreted as limiting. The embodiments described above often show N-channel devices, the embodiments can also be applied to P-channels devices by reversing the polarities of the conductivity types. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. An integrated circuit comprising a SGT MOSFET and a SBR horizontally disposed in two different areas on a single chip, further comprising:
   an epitaxial layer of a first conductivity type extending over a substrate of said first conductivity type, said substrate having a higher doping concentration than said epitaxial layer;
   said SGT MOSFET further comprising:
   a plurality of first type trenches formed in said epitaxial layer, each of said first type trenches being filled with a first shielded electrode and a first gate electrode, said shielded electrode being insulated from said epitaxial layer by a first insulating film, said first gate electrode being insulated from said epitaxial layer by a first gate oxide, said first shielded electrode and said first gate electrode being insulated from each other;
   a first body region of a second conductivity type having a first source region of said first conductivity type thereon and surrounding said first gate electrode padded by said first gate oxide;
   said SBR further comprising:
   at least one second type trench formed in parallel with said first type trenches, said second type trench being filled with a second shielded electrode and a second gate electrode, said second shielded electrode being insulated from said epitaxial layer by a second insulating film, said second gate electrode being insulated from said epitaxial layer by a second gate oxide, said second shielded electrode and said second gate electrode being insulated from each other;
   said second gate oxide having a thickness less than said first gate oxide;
   a second body region of said second conductivity type having a second source region thereon and surrounding said second gate electrode padded by a second gate oxide;
   said first body region, said second body region, said first source region, said second source region, and said second gate electrode are shorted to a source metal through a plurality of trenched contacts;
   said second body region has a shallower junction depth and a lower doping concentration than said first body region; and
   said epitaxial layer has MSE layers with different doping concentrations decreasing stepwise in a direction from said substrate to a top surface of said epitaxial layer, wherein each of said MSE layers has an uniform doping concentration as grown.

2. The integrated circuit of claim 1, wherein said epitaxial layer comprises at least two stepped epitaxial layers of different doping concentrations including a bottom epitaxial layer with a doping concentration D1 and a top epitaxial layer above said bottom epitaxial layer with a doping concentration D2, wherein said D2<said D1.

3. The integrated circuit of claim 1, wherein said epitaxial layer comprises at least three stepped epitaxial layers of different doping concentration including a bottom epitaxial layer with doping concentration D1, a middle epitaxial layer with doping concentration D2 and a top epitaxial layer with doping concentration D3, wherein said D3<said D2<said D1.

4. The integrated circuit of claim 3, wherein said D2 is an average of said D1 and said D3.

5. The integrated circuit of claim 1, wherein said multiple stepped epitaxial layers have a bottom epitaxial layer above said substrate and beyond bottoms of said gate trenches.

6. The integrated circuit of claim 1, wherein within each of said first type trenches, said first shielded electrode is disposed in a lower portion and said first gate electrode is disposed in an upper portion, said first shielded electrode and said first gate electrode are insulated from each other by a third insulating film: within said second type trench, said second shielded electrode is disposed in a lower portion and said second gate electrode is disposed in an upper portion, said second shielded electrode and said second gate electrode are insulated from each other by a fourth insulating film.

7. The integrated circuit of claim 1, wherein said second type trench has a trench width and a trench depth same as said first type trenches.

8. The integrated circuit of claim 1, wherein said second type trench has a trench width and a trench depth wider than said first type trenches.

* * * * *